(12) United States Patent
Price

(10) Patent No.: US 8,674,698 B2
(45) Date of Patent: Mar. 18, 2014

(54) TRANSMIT/RECEIVE SWITCH FOR A MINIATURIZED NMR DEVICE

(75) Inventor: John C. Price, Longmont, CO (US)

(73) Assignee: picoSpin, LLC, Boulder, CO (US)

( * ) Notice: Subject to any disclaimer, the term of this patent is extended or adjusted under 35 U.S.C. 154(b) by 192 days.

(21) Appl. No.: 13/170,972

(22) Filed: Jun. 28, 2011

(65) Prior Publication Data

US 2011/0316540 A1    Dec. 29, 2011

Related U.S. Application Data

(60) Provisional application No. 61/359,681, filed on Jun. 29, 2010.

(51) Int. Cl.
*G01V 3/00* (2006.01)

(52) U.S. Cl.
USPC ............................... 324/322; 324/318

(58) Field of Classification Search
USPC ................... 324/322, 319, 318, 300
See application file for complete search history.

(56) References Cited

U.S. PATENT DOCUMENTS

| | | | |
|---|---|---|---|
| 3,573,501 A * | 4/1971 | Diehl | 327/494 |
| 3,597,633 A | 8/1971 | Hirano | |
| 4,717,881 A * | 1/1988 | Flugan | 324/322 |
| 4,782,295 A | 11/1988 | Lew | |
| 4,785,245 A | 11/1988 | Lew et al. | |
| 5,654,636 A | 8/1997 | Sweedler et al. | |
| 5,684,401 A | 11/1997 | Peck et al. | |
| 6,097,188 A | 8/2000 | Sweedler et al. | |
| 6,242,918 B1 * | 6/2001 | Miller et al. | 324/322 |
| 6,456,072 B1 | 9/2002 | Webb et al. | |
| 6,788,061 B1 | 9/2004 | Sweedler et al. | |
| 6,822,454 B2 | 11/2004 | Peck et al. | |
| 7,141,978 B2 | 11/2006 | Peck et al. | |
| 2002/0140425 A1 | 10/2002 | Prammer et al. | |
| 2002/0149369 A1 | 10/2002 | Peck et al. | |
| 2003/0020476 A1 | 1/2003 | Duensing | |
| 2005/0030033 A1 | 2/2005 | Peck et al. | |
| 2005/0253587 A1 | 11/2005 | Peck et al. | |
| 2006/0213283 A1 | 9/2006 | Morris et al. | |
| 2007/0132452 A1 | 6/2007 | Alsop | |
| 2007/0164737 A1 | 7/2007 | Pusiol | |
| 2008/0136416 A1 | 6/2008 | Goetz et al. | |
| 2008/0186024 A1 | 8/2008 | Edwards | |

OTHER PUBLICATIONS

Andrew G. Webb, Radiofrequency Microcoils in Magnetic Resonance, Jan. 27, 1997, Department of Electrical and Computer Engineering, University of Urbana-Champaign.

(Continued)

*Primary Examiner* — Louis Arana
(74) *Attorney, Agent, or Firm* — Cochran Freund & Young LLC; Michael C. Staggs

(57) ABSTRACT

A single-pole, double-throw, transmit/receive switch for switching a NMR coil between a transmit mode and a receive mode comprises two diode bridge switches on opposites sides of a node the is common with the two diode bridges and the NMR coil. One of the two diode bridges is positioned between the coil and a preamplifier for signals received from the coil, and the other diode bridge is positioned between the coil and a RF signal transmitter for connecting and disconnecting transmitted signals to and from the coil. The NMR coil is connected to the switches through a resonant impedance matching network.

3 Claims, 1 Drawing Sheet

Single-Pole Double-Throw Transmit/Receive Switch

(56) References Cited

OTHER PUBLICATIONS

Odeblad, Coils for Microgram Samples and the Associated Circuitry, 1966, Acta Obstet Gynecol Scand, vol. 45, chptr 9, pp. 84-98 (downloaded from informahealthcare.com by University of Colorado Libraries on Aug. 10, 2010).

Alison Nordon, Colin A. McGill and David Littlejohn, Process NMR Spectrometry, Jan. 25, 2001, Department of Pure and Applied Chemistry, Glasgow, UK.

* cited by examiner

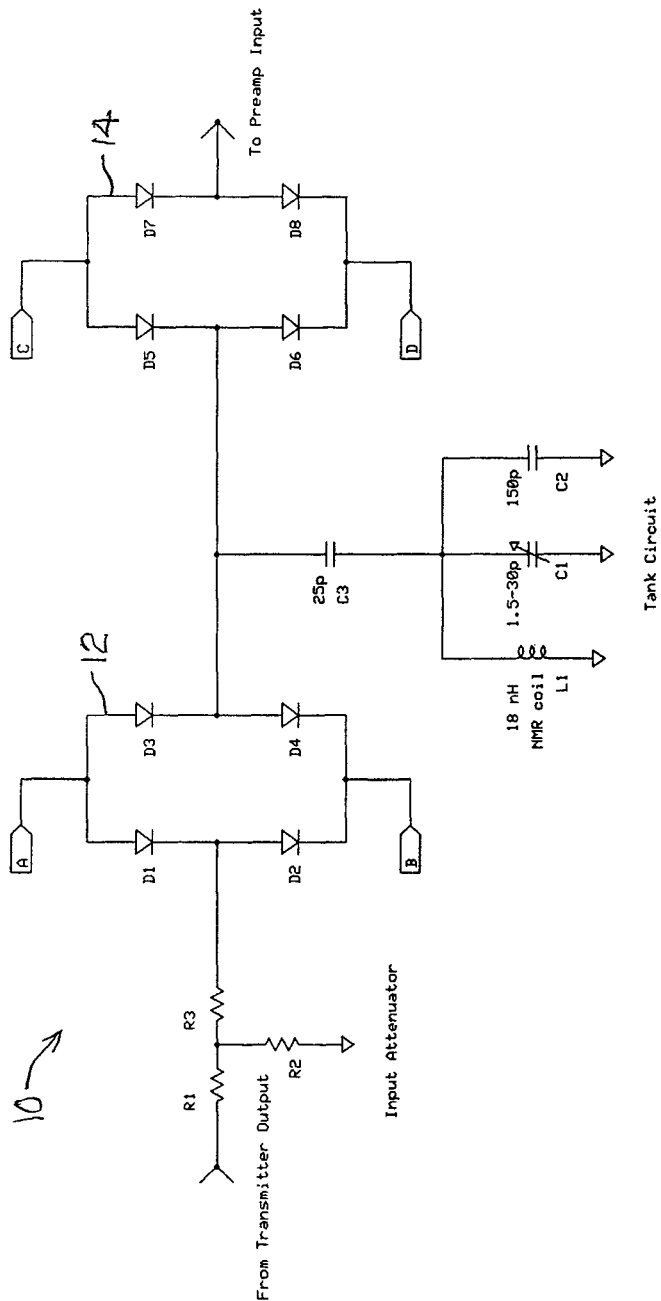

TRANSMIT/RECEIVE SWITCH FOR A MINIATURIZED NMR DEVICE

CROSS REFERENCE TO RELATED APPLICATION

The present application is based upon and claims the benefit of U.S. Provisional Patent application No. 61/359,681, titled "Transmit/Receive Switch for A Miniaturized NMR Device," filed Jun. 29, 2010, by John C. Price. The entire content of the above-mentioned application is hereby specifically incorporated herein by reference for all it discloses and teaches.

BACKGROUND OF THE INVENTION

Nuclear magnetic resonance (NMR) techniques are widely used for analyzing properties of fluids and solids. NMR instruments may be placed into three classes: 1) magnetic resonance imaging (MRI) devices, which emphasize high spatial resolution; 2) NMR spectrometers, which have little or no spatial resolution but are able to resolve nuclear resonances that are closely-spaced in frequency; 3) time-domain NMR devices with neither spatial nor frequency resolution. In general, but recognizing there are many exceptions, MRI devices are used primarily in medicine and biological research to image live organisms, NMR spectrometers are used by chemists and biochemists to analyze structures of molecules, and time-domain NMR instruments are used to analyze materials properties at a coarser level than the molecular scale.

Nearly all modern NMR spectrometers are large (greater than 1 m$^3$) and use superconducting magnets cooled to cryogenic temperatures. The magnet systems and associated NMR probes and electronics are expensive (roughly $300 K to $10 M) and they require substantial facilities and maintenance support. There are also some less-powerful NMR spectrometers that use ambient-temperature permanent magnets. These machines are similar in size to the smallest of the superconducting magnet systems, but are somewhat less expensive to purchase and maintain The power of NMR spectroscopy for chemical analysis derives from its ability to resolve small "chemical shifts" of the nuclear magnetic resonances due to differing chemical environments. For example, the magnetic resonance frequency of hydrogen nuclei (protons) in a $CH_3$ chemical group within a liquid alkane differs from the resonance frequency of the protons in a $CH_2$ group by about 0.5 parts-per-million (ppm). Nearly all chemical shifts of protons in organic molecules are in the range 0 to 12 ppm. Chemical shift ranges are larger for some nuclear species and smaller for others. Because of the widespread application of proton NMR and the central role of hydrogen in organic chemistry, an NMR device is not usually considered to be a spectrometer unless it can resolve most proton chemical shifts. For our purposes, we define an NMR spectrometer to be an instrument with resolution better than 1.0 ppm for protons. Thus, time-domain NMR devices have spectral resolution poorer than 1.0 ppm and do not have spatial resolution In typical NMR spectrometers, a sample is placed in a region of uniform magnetic field. A wire coil and electronic circuits are provided to both apply radio-frequency (RF) pulses to the sample (transmit) and to detect RF signals from the sample (receive). In a typical experiment or measurement, the protons (or other nuclei under study) in the sample are first allowed to polarize in the magnetic field. Establishing equilibrium polarization takes a time which is known as $T_1$ in the NMR art. This time ranges from a fraction of a second up to 20 seconds, depending on the composition of the liquid sample. Next, one or more RF pulses are applied to the sample with frequencies at or near the resonance frequency at which the protons freely precess in the applied uniform magnetic field. The transmit pulses have the effect of tilting the proton polarization relative to the direction of the applied field. After the transmit pulse is ended the protons precess and create a time-varying magnetic field in the coil. The time-varying field induces a signal voltage in the coil which may be amplified and recorded. Either immediately, or after a delay time, the receive signal is recorded and transferred to a computer for processing.

A particular sequence of transmit pulses, delay times and data acquisition periods, together with all of the parameters needed to precisely define the sequence (times, frequencies, phases, acquisition rates) is know in the NMR art collectively as a pulse sequence. The design of NMR pulse sequences to extract desired information from a sample is a well-developed area of knowledge. A great variety of pulse sequences are known in the art, ranging from simple ones with a single transmit pulse and a single data acquisition time to much more complex sequences with many transmit pulses, time delays, transmitter phase and amplitude adjustments, and data acquisition periods. The goals of these sequences vary widely, including enhancement of spectroscopic resolution, enhancement of signal-to-noise ratio, detection of spin-spin coupling between different groups of protons (or other nuclei), suppression of strong solvent signals, suppression of coupling between like or unlike nuclei, transfer of polarization from one group of nuclei to another, measurement of relaxation rates, measurement of diffusion within the fluid and measurement of fluid flow.

Permanent magnets can be, and often are, used to create the uniform magnetic field. Such permanent magnets typically used for this purpose are made from hard magnetic material with high remnant magnetization, such as neodymium iron boron or samarium cobalt. Permanent magnets of this type have large temperature coefficients of magnetization, typically in the range 300 to 2000 ppm/° C. Because the magnetic resonance frequencies are proportional to the applied magnetic field, this implies that permanent magnet NMR spectrometers have temperature coefficients of the resonance frequencies also in the range 300 to 2000 ppm/° C. To achieve spectral resolution below 1 ppm, this temperature coefficient has to be negated, stabilized, or compensated for in some way. Methods known in the art, as applied to larger NMR spectrometers, include use of a temperature compensating magnetic material within the magnet, temperature control of the magnet, and the field-frequency lock method.

The best magnetic uniformity of most typical permanent magnet assemblies used for NMR devices is at the geometrical center of the magnet assembly, so the main channel RF coil is typically placed at the geometrical center of the magnet assembly for best NMR signal resolution.

The foregoing examples of related art and limitations related therewith are intended to be illustrative and not exclusive. Other limitations of the related art will become apparent to those skilled in the art upon a reading of the specification and a study of the drawings.

BRIEF DESCRIPTION OF THE DRAWING

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings:

FIG. 1 is a schematic diagram of an example circuit for the single-pole, double-throw, transmit/receive switch for an NMR device.

DESCRIPTION OF EXAMPLE IMPLEMENTATIONS

While NMR technologies, apparatus, and methods for implementing NMR spectrometers, imaging systems, and time-domain devices have all become well-developed, as explained above, the large sizes typically used to obtain sufficient resolution are impractical for many potential applications and put the costs of such systems far in excess of costs that can be justified in many other applications where NMR analysis or measurements would be very useful and beneficial. For example, smaller, less expensive NMR spectrometers than those now available could be useful to monitor the chemical composition of a fluid in an industrial manufacturing process at many locations and to do so continuously in real time. With equipment known in the art, such measurements at multiple locations would require that samples be gathered and transported to a centralized NMR spectrometer where they would have to be analyzed one at a time. With a smaller NMR spectrometer that had sufficient frequency resolution, it would instead be practical and cost-effective to install a number of dedicated NMR spectrometers at various monitoring sites within the factory, to connect them all to a computer network, and to collect and analyze the data from the multiple sites at a single location.

Many other applications would also be feasible because of the much lower cost of a miniaturized NMR spectrometer. For example, NMR can be used to measure sugar or alcohol content of beverages, and sugar content of fruit juices. Traditional NMR spectrometers are too costly for these applications. Similarly, a miniature NMR spectrometer could be used to measure the alcohol fraction or other chemical fractions in gasoline and other fossil fuels, and in bio-fuels. Such NMR spectrometry applications are currently practical in laboratories, but not in most production, quality control, fuel custody transfer, inspection, or engine testing applications. A smaller, less expensive NMR spectrometer with sufficient frequency resolution may also have applications in the pharmaceutical industry to manufacturing, regulatory control, and quality control; to analysis of body fluids; to chemical manufacturing; and to bench laboratory use in chemical research and to chemical education.

Pulsed NMR spectrometer operation includes two modes, called transmit and receive. In the transmit mode, an RF transmitter applies power to a coil which then applies an RF magnetic field to the sample. In receive mode, a coil in proximity to the sample is subject to an RF magnetic field generated by nuclear spins precessing in the sample, this RF magnetic field induces a voltage in the coil, and the voltage is conveyed to the receiver preamplifier. The transmit mode and receive mode coils may be separate coils or the same coil may be used for both functions.

In most NMR spectrometer designs, fast RF signal switches are required between the transmitter output and the coil or coils and also between the coil or coils and the receiver preamplifier input. These switches are required for matching between the coil and transmitter and for matching between the coil and receiver preamplifier. In the case of the transmitter, the type of matching required is known as power matching because it efficiently transmits power from the transmitter to the coil. In the case of the receiver, the type of matching required is known as noise matching because it optimizes the signal-to-noise ratio. The switches may also be required to block noise from the transmitter from entering the receiver in receive mode, and/or to stop transmitter signals from saturating or damaging the receiver in transmit mode. The speed requirements for the switches vary widely according to the kind of NMR operation or measurement being undertaken, e.g., spectroscopy, flow metering, imaging, or the like. Speed requirements can also vary widely within those kinds of applications. For example, speed requirements for liquid-phase NMR spectroscopy may be different than for solid state spectroscopy. In most liquid-phase NMR spectroscopy applications it is sufficient to switch with transition times less than five microseconds.

In the NMR art, transmitter switching is often accomplished passively using semiconductor diodes in series with the signal path. When the transmitter is off, the diode bias voltages are close to zero and the diodes present an open circuit to the signal path. In this case the transmitter switch is in the off state. When the transmitter is turned on, the diodes are periodically or continuously forward-biased. In this case they present a low-impedance path to the transmitter signal and the transmitter switch is in the on state. Switching of this type is referred to as passive because it is actuated by the transmitter signal itself and not by separate control signals. Active transmitter switches are not used because they add unnecessary complexity and active switches may have difficulty handling the high powers often used in NMR transmitters. In contrast, receiver switches must be active. In receive mode, the signal at the receiver input is not large enough to forward bias a semiconductor diode and turn it on.

In some NMR spectrometers known in the art, active switching of power supplied to the transmitter amplifier output stages is used. This contributes to reducing noise from the transmitter in receive mode but does not address the matching problem. This type of active switching is usually applied together with a passive series-diode transmitter signal switch.

The example NMR spectrometer RF switching system shown schematically in FIG. 1 has specific benefits for a miniature NMR device, such as a miniature NMR spectrometer. In a miniature NMR spectrometer, the sample is reduced in size correspondingly so that a sufficiently homogenous magnetic field region can be applied throughout the sample volume. A homogenous magnetic field is required to provide the frequency resolution necessary for a useful spectrometer. When the sample volume is reduced in size, it is also necessary to correspondingly reduce the size of the receiver RF coil to optimize the signal-to-noise ratio. Therefore, to fit within the small gap between adjacent poles of the NMR magnet system, the RF coil or coils have to be very small, e.g., smaller than those typically used in larger spectrometers known in the art. For coils with diameters smaller than 1 mm, the transmitter power required to create an adequate RF magnetic field in the coil may be too small to actuate a passive transmitter switch, or it may be barely adequate. In either case, it would be necessary to use more transmitter power than would be required by the coil if an active switch were used. This power requirement is a disadvantage in a miniature NMR spectrometer because a higher power transmitter will be more costly and larger than a lower power transmitter. Moreover, many applications are known in the NMR art for amplitude-modulated RF transmitter pulses. Such pulses are referred to as shaped pulses in the NMR art. If a passive switch is used and the transmitter power is barely adequate to turn the switch on, there will be a strongly non-linear relationship between the signal voltage generated by the transmitter and the signal voltage actually applied to the coil. This non-linearity makes it more difficult to create shaped pulses in a controlled and reproducible way.

An example implementation of the disclosed RF switch arrangement is illustrated in FIG. 1, together with typical connections to an NMR coil and matching network. The switch 10 comprises two diode bridges(switches) 12, 14, each containing four diodes—D1, D2, D3 D4 in diode bridge 12 and D5, D6, D7, D8 in diode bridge 14. The 4-diode switches 12,14 are on when all four diodes are forward biased and off when all four diodes are reverse biased. The four-diode switch 14 on the right side of the FIG. 1 is connected to the preamplifier and is the receiver switch. The four-diode switch 12 on the left side of FIG. 1 is connected to the transmitter and is the transmitter switch. In transmit mode, terminal A is at a positive voltage, terminal B is at a negative voltage and the transmit switch is on. Also in transmit mode, terminal C is at a negative voltage, terminal D is at a positive voltage and the receiver switch is off. In receive mode, terminal A is at a negative voltage, terminal B is at a positive voltage and the transmit switch is off Also in receive mode, terminal C is at a positive voltage, terminal D is at a negative voltage and the receiver switch is on. The NMR coil (not shown) is connected to the switches 12, 14 through a resonant impedance matching network comprising a fixed series capacitor C3, a parallel adjustable capacitor C1, and a fixed parallel capacitor C2. Persons skilled in the art of RF electronics will be aware that component losses, stray inductances, and stray capacitances must be taken into account in the design and analysis of RF matching networks.

An NMR transmit/receive switch 10 was constructed as shown in FIG. 1. The coil matching network was adjusted so that its impedance at the top of C3 was 50 Ohms at 45 MHz. The transmitter output impedance and receiver input impedance were also 50 Ohms. The input attenuator shown in FIG. 1 was shorted.

A complete miniature NMR spectrometer was constructed using the disclosed transmit/receive switch and was shown to operate with a spectral resolution for protons of 0.123 ppm.

The foregoing description provides examples that illustrate the principles of the invention, which is defined by the claims that follow. Since numerous insignificant modifications and changes will readily occur to those skilled in the art once they understand the invention, it is not desired to limit the invention to the exact example constructions and processes shown and described above. The words "comprise," "comprises," "comprising," "include," "including," and "includes" when used in this provisional application are intended to specify the presence of stated features, integers, components, or steps, but they do not preclude the presence or addition of one or more other features, integers, components, steps, or groups thereof. The terms upper, upwardly, lower, bottom, top, down, downwardly, vertical, horizontal, and other directional terms in this description are in reference to the diagrammatic orientations depicted in the drawings and are only used for convenience and clarity in this description unless otherwise indicated.

What is claimed is:

1. A transmit/receive switch apparatus for switching a NMR coil between a transmit mode and a receive mode, comprising:
a first bridge switch comprising four diodes and a second bridge switch also comprising four diodes, wherein each of the bridge switches are on opposite sides of a node that is not only common with the first bridge switch and the second bridge switch but is also common with a coupled NMR coil, and wherein either the four diodes of the first bridge switch or the four diodes of the second bridge switch are actively on when all four of its diodes are forward biased by control signals and actively off when all four of its diodes are reverse biased by control signals.

2. The transmit/receive switch apparatus of claim 1, wherein the second bridge switch operates as a switch positioned between the NMR coil and a preamplifier for signals received from the coupled NMR coil, and wherein the first bridge switch operates as a switch positioned between the coupled NMR coil and a RF signal transmitter for connecting and disconnecting transmitted signals to and from the coil.

3. The transmit/receive switch apparatus of claim 1, wherein the coupled NMR coil is configured with a diameter that is less than 1 millimeter (mm).

* * * * *